United States Patent [19]

Monkowski et al.

[11] Patent Number: 5,104,482
[45] Date of Patent: Apr. 14, 1992

[54] SIMULTANEOUS GLASS DEPOSITION AND VISCOELASTIC FLOW PROCESS

[75] Inventors: Joseph R. Monkowski, Danville; Mark A. Logan, Leucadia; Lloyd F. Wright, Carlsbad, all of Calif.

[73] Assignee: Lam Research Corporation, Fremont, Calif.

[21] Appl. No.: 666,464

[22] Filed: Mar. 5, 1991

Related U.S. Application Data

[63] Continuation of Ser. No. 314,404, Feb. 21, 1989, abandoned.

[51] Int. Cl.$^5$ .................................... C23C 16/40
[52] U.S. Cl. ........................... 156/643; 156/662; 437/236; 437/238; 437/982; 148/DIG. 133; 427/255; 427/255.3
[58] Field of Search .................... 427/255, 255.3; 437/236, 238, 240, 982; 148/DIG. 133; 156/643, 662

[56] References Cited

U.S. PATENT DOCUMENTS

| | | | |
|---|---|---|---|
| 4,217,375 | 8/1980 | Adams | 437/240 |
| 4,571,819 | 2/1986 | Rogers et al. | 148/DIG. 133 |
| 4,708,884 | 11/1987 | Chandross et al. | 427/39 |
| 4,791,005 | 12/1987 | Becker et al. | 437/240 |
| 4,800,105 | 1/1989 | Nakayama | 427/255 |
| 4,879,253 | 11/1989 | Wakamatsu | 148/DIG. 133 |

FOREIGN PATENT DOCUMENTS 0123725  6/1987  Japan ................................ 437/982

OTHER PUBLICATIONS

Kern et al., Chemically Vapor Deposited Borophosphosilicate Glasses for Silicon Device Applications, RCA Review vol. 43 Sep. 1982 p. 425.
Adams et al., The Deposition of Silicon Dioxide Films at Reduced Pressure, J. Electrochem Soc.: Solid-State Science and Technology, p. 1042 (Jun. 1979).
Sugawara et al., Formation of PSG Film Using Organic Compounds and Its Application to Silicon Device Fabrication, 5th International Conference on CVD, p. 407 (1975).
Kern et al., Borophosphosilicate Glasses for Integrated Circuits, Solid State Technology vol. 28, 171 (Jun. 1985).
Williams et al., LPCVD of Borophosilicate Glass from Organic Reactants, J. Electrochem. Soc'y; Solid State Science and Technology vol. 134, No. 3, 657, (Mar. 1987).
Levy et al., Low Pressure Chemical Vapor Deposition of Borophosphosilicate Glass Films Produced by Injection of Miscible DADBS-TMB-TMP Liquid Sources, J. Electrochem. Soc'y; Solid State Science and Technology vol. 134, No. 7, 1744 (Jul. 1987).
Levy et al., A new LPCVD Technique for Producing Borophosphosilicate Glass Films by Injection of Miscible Liquid Precursors, J. Electrochem Soc'y; Solid State Science and Technology vol. 135, No. 2 430 (Feb. 1987).
Levy et al., Viscous Behavior of Phosphosilicate and Borophosphosilicate Glasses in VLSI Processing, Solid State Technology vol. 29, 123 (OCt. 1986).
Mercier, Rapid Flow of Doped Glasses for VLSIC Fabrication, Solid State Technology vol. 30, No. 7, 85 (Jul. 1987).
Becker, et al., Process and Film Characterization of Low Pressure Tetraethylorthosilicate-Borophosphosilicate Glass, J. Vac. Sci. Technol. vol. B4, No. 3, 732 (May/Jun. 1986).

Primary Examiner—Richard V. Fisher
Assistant Examiner—Todd J. Burns
Attorney, Agent, or Firm—Blakely, Sokoloff, Taylor & Zafman

[57] ABSTRACT

A glass deposition viscoelastic flow process for forming planar and semi-planar insulator structures on semiconductor devices, which comprises feeding vaporized reactants into a reaction chamber at a reaction temperature between 750°–950° C. and subjecting the surface of the semiconductor devices to a high reactant velocity. The high reactant velocity allows the formation of a high quality, uniform glass layer at temperatures compatible with the fusion temperature, so that deposition occurs simultaneously with the viscoelastic flow of the glass. The simultaneous deposition and flow provides for topographical planarization substantially free of voids and other layer inconsistencies.

21 Claims, 4 Drawing Sheets

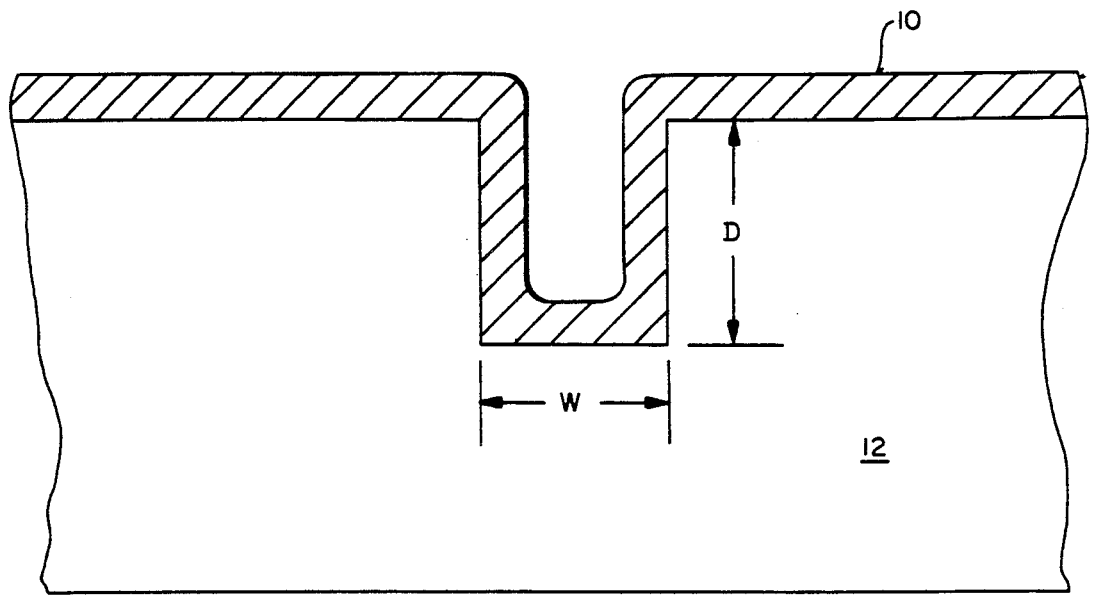
FIG_1A
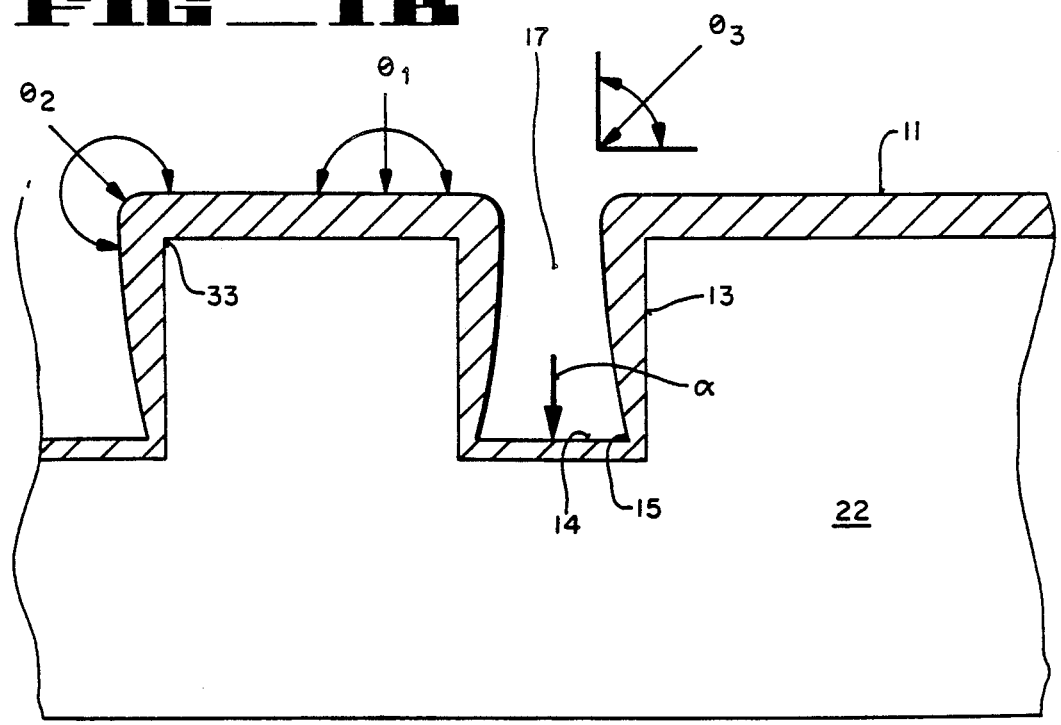
FIG_1B

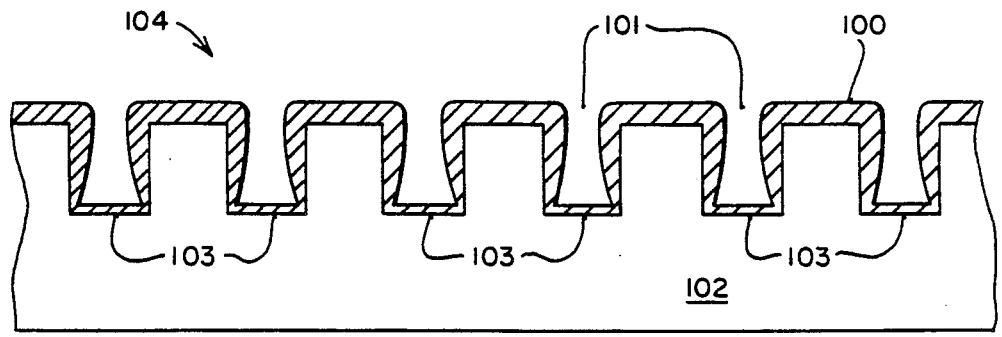
FIG_2A (PRIOR ART)
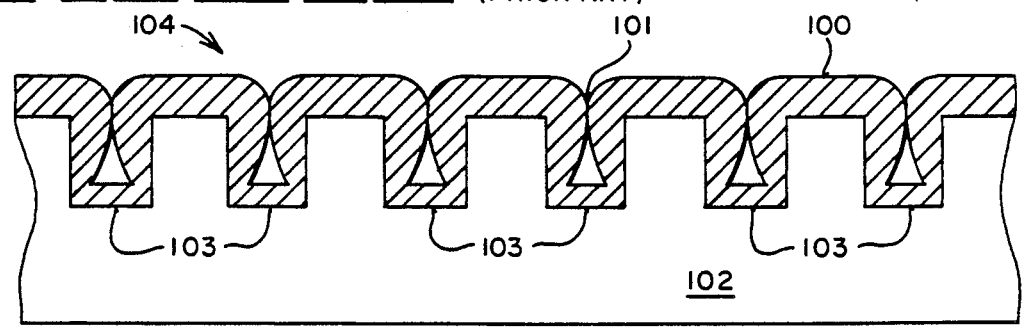
FIG_2B (PRIOR ART)
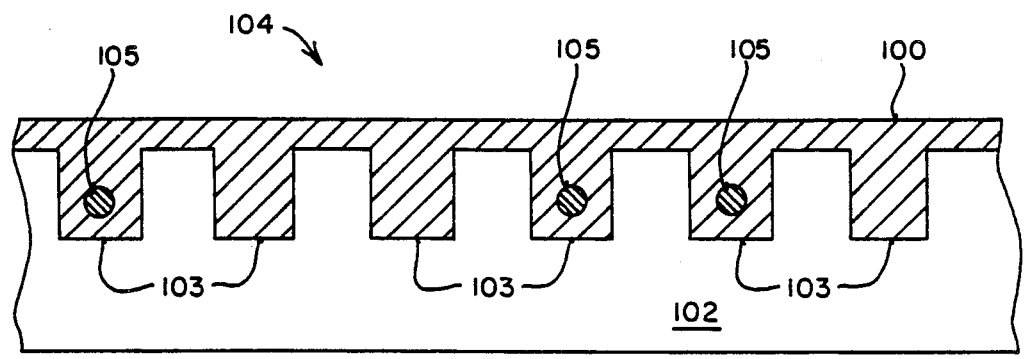
FIG_2C (PRIOR ART)

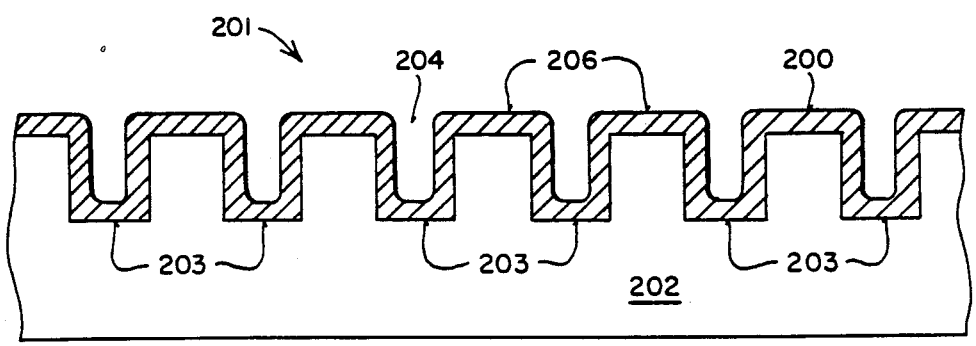
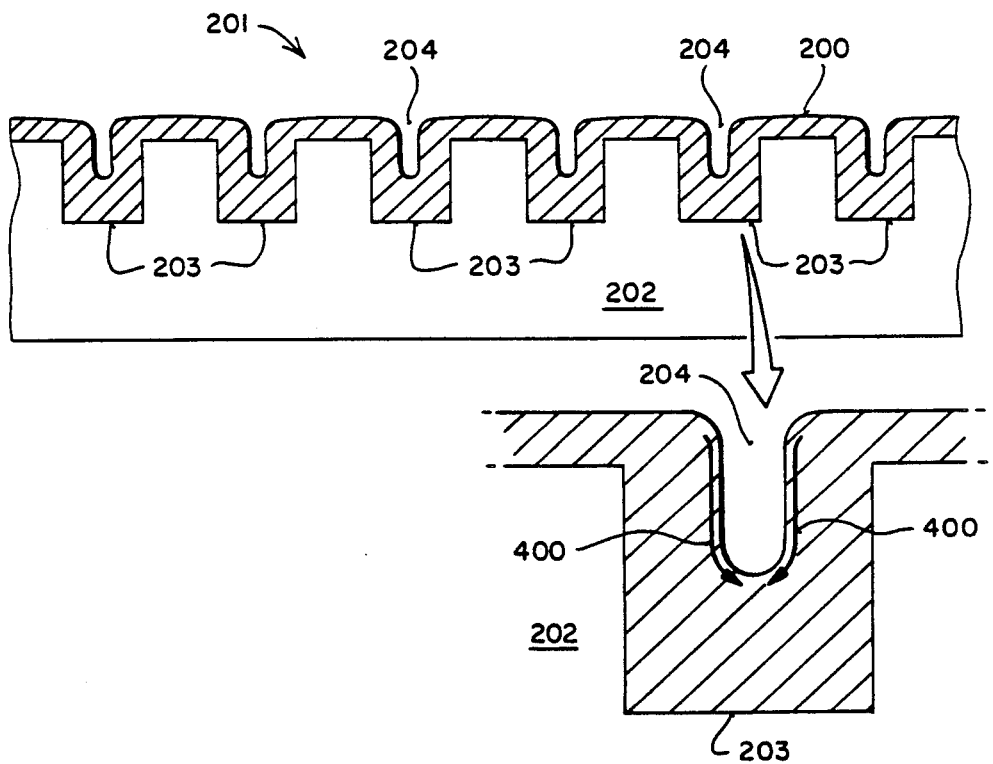
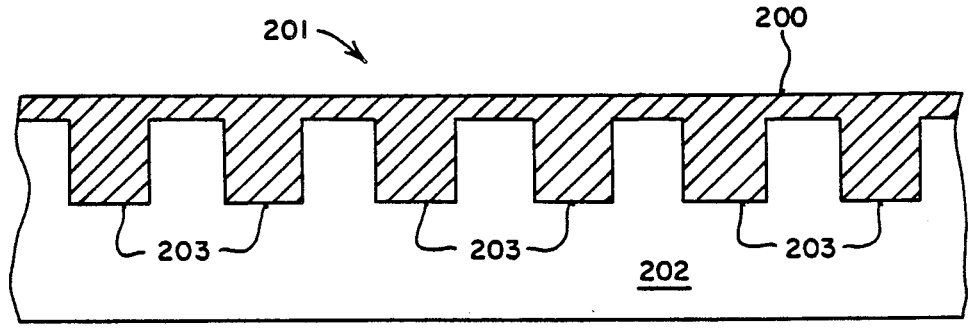

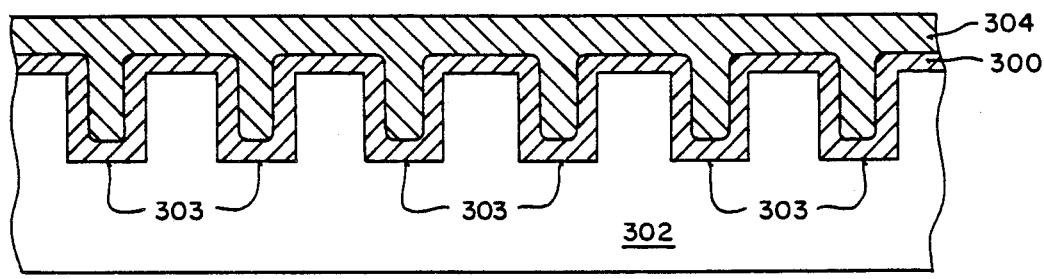
FIG_4
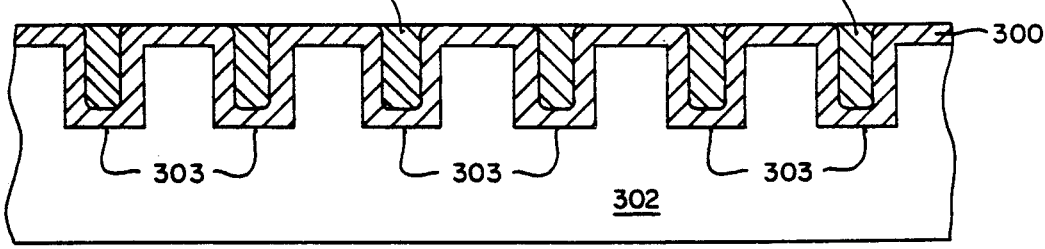
FIG_5

SIMULTANEOUS GLASS DEPOSITION AND VISCOELASTIC FLOW PROCESS

This is a continuation of application Ser. No. 07/314,404 filed Feb. 21, 1989, abandoned.

BACKGROUND OF THE INVENTION

1. Field of the Invention

The present invention relates to forming planar and semi-planar insulator structures on semiconductor devices and more specifically to a chemical vapor deposition process that allows for simultaneous deposition and viscoelastic flow for semiconductor integrated fabrication.

2. Prior Art

Increasing demands on advanced very large scale integrated circuit (VLSI) metal-oxide semiconductor (MOS) devices in terms of numbers of functions and circuit speed require size reduction of circuit structures, as well as an increase in the number of conductor and insulator layers. Chemical vapor deposition (CVD) is a process which has developed in the semiconductor industry for manufacturing integrated and discrete semiconductor devices such as the above mentioned MOS devices.

In a typical manufacturing process a large (2-8 inch; 50-200 millimeter) wafer of silicon, germanium or similar material in extremely pure crystalline form is overlayed sequentially with numerous layers of material which function as conductors, semiconductors or insulators. Each subsequent layer is deposited and patterned usually by photolithographic techniques such that the sequence of layers forms a complex array of electronic circuitry. However, the multiple layers can be formed only with difficulty unless the substrate topography is planarized in an early stage of the manufacturing process and is then maintained as closely as possible to a planar surface throughout subsequent layer depositions.

Generally each device on the wafer is much smaller than the wafer itself. Once the wafer has been manufactured, one of the final steps in the manufacturing sequence is to cut the wafer along predetermined scribe lines to many individual devices which are commonly referred to as "chips." However, because the chips are so small and their circuitry is so complex, almost any flaw or irregularity in a layer can disrupt the circuit patterns and render a given chip useless. Indeed it is fairly common for a substantial percentage of the chips on a wafer to be found defective upon testing. For example, using a prior art technique of film deposition followed by thermal fusion flow to planarize a glass layer can cause voids or other layer inconsistencies.

Thermal fusion flow, used as a generic term for glass flow and glass reflow is generally performed on the pre-metal dielectric passivation layers used in typical metal-oxide semiconductor (MOS) fabrication sequences. The flow is used to densify the glass layer and prepare it for a subsequent contact hole etch, and at the same time to improve its step coverage properties. The topography-smoothing measure is intended to ensure the continuity of the overlying metallization (See Prior Art Reference No. 7).

Although the use of a thermal fusion flow process is fairly common to obtain smooth or planarized successive layers, the likelihood of voids and other inconsistencies in the layers and the temperatures necessary to achieve the flow can foreclose the application of the thermal fusion flow process to heat sensitive VLSI devices.

A typical CVD glass layer is generally comprised of approximately six to eight weight percent (6-8 wt %) phosphorus-containing phosphosilicate glass (PSG). The ability of PSG to undergo viscoelastic flow at a given temperature is primarily a function of the phosphorus content in the glass; however, temperatures necessary to achieve flow of the PSG layer, that is 1050° C. to 1100° C., preclude the use with heat sensitive VLSI devices. (See Prior Art Reference No. 6) However, the incorporation of boron into PSG to form a borophosphosilicate glass (BPSG) has made it possible to reduce the thermal fusion flow temperature by as much as 300° C. without impairing the excellent properties of BPSG. In terms of stress and other properties, BPSG surpasses the standard PSG (See Prior Art Reference No. 5). Additionally, BPSG layers have been employed successfully as inner layer insulators for contour tapering and planarization of CMOS VLSI circuits (See Prior Art Reference No. 1).

The conventional method for BPSG processing consists of formation of the glass layer by CVD. CVD processes operate on the basis of two surface reaction steps. First, one or more reactive gases, from which the compound or elements to be deposited will be obtained, are passed over the surface of the wafer under reaction conditions at which the wafer surface will catalyze the liberation of the deposited materials. In some cases the reactive gas will be introduced directly into the reactor, while in others it will be formed "in situ" in the gas space in the reactor by reaction from other introduced gases.

The liberation reaction at the wafer surface may be a combination reaction in which two gases react to yield the deposit material and usually at least one gas as a by-product, or it may be a decomposition reaction in which a single reactive gas is decomposed to yield the deposit material and one or more by-product gases. The liberation reaction is followed by a second surface reaction in which the deposit material chemically combines with the surface of the wafer to form an integral bond and build up a layer or film of deposited material. For example, the BPSG deposition is normally done after the completion of high temperature processes such as epitaxy; oxidation; diffusion; refractory metal; metal silicide or polycide formation; or silicon nitride deposition on a device wafer. Deposition of BPSG is achieved by the co-oxidation of the hydride gases silicon hydride ($SiH_4$), boron hydride ($B_2H_6$) and phosphorus hydride ($PH_3$) with $O_2$ at atmospheric or a low pressure in the temperature range of 350°–430° C. (See Prior Art Reference No. 1 and 5).

Alternatively, oxygen assisted vapor pyrolysis of TEOS also known as tetraethylorthosilicate or tetraethoxysilane, with trimethylborate (TMB) as a boron source and phosphine as a phosphorus source, can be used at low pressure of 0.3-1 torr and in the temperature range of approximately 640°-660° C. (See Prior Art References No. 2, 3, 4 and 8). Typically CVD reaction conditions and reactor parameters must be within certain narrow limits if the necessary surface reaction conditions, necessary for formation of void-free uniform films are to be maintained and a satisfactory yield of uniform well bonded layers of the deposited materials obtained.

Due to numerous problems which can commonly occur during CVD processes or due to the size of the geometries of the wafer itself, a batch of wafers from a single reactor run may not have uniform thickness of the deposited layer over all the wafers. Prior Art Reference No. 3 describes some of the problems associated with prior art CVD processes. Additionally, some of the geometries may not be covered at all by the deposited glass layer. After the deposition of the glass layer, the coated devices are exposed to a sufficiently high temperature that is compatible with the thermal fusion flow of the deposited glass. After a time period long enough to cause the glass to soften viscoelastically, the desired effect of contour modification which can range from step tapering to partial or full planarization can be produced. Theoretically, the thermal fusion flow process is to remedy the inconsistencies of the deposited layer thickness and to fill and planarize the geometries on the wafer. However, because of the very low viscosity required, the partial or full planarization of the layer may be difficult to achieve by conventional techniques. The flow in a BPSG glass improves with higher temperatures until achieving a substantially planarized topography at approximately 950° C. These techniques are described in Prior Art Reference No. 4.

The wafers are then patterned by photolithography and etching to form contact windows through the glass to the underlying conductor areas. In some cases, a second fusion known as reflow, is executed to round the edges of the openings in the glass. The structure is now ready for deposition of the next layer of conductor material that will result in a continuous layer of uniform thickness, a feature essential to the achievement of improved device yields and improved reliability.

An alternative process that can be used to produce a planarized structure is based on depositing a very thick (in terms of step heights) and extremely conformal layer of an insulator material, followed by reactive ion etching to reduce the thickness of the planarized insulator to an acceptable level. This method is cumbersome and slow, since it requires the deposition and etch back of thick layers. Worse, it is limited by the pattern aspect ratio, H/W, (step height/step-to-step spacing) of about 2.5, precluding its application to small pattern geometries.

However, a severe limitation of the conventional technology is the ability to produce a truly planarized insulator structure compatible with pattern features of advanced VLSI MOS circuits typically ranging from 1 or 2 microns to as small as 0.3 microns. An identified problem is that once the CVD layer starts to flow, there is the possibility that micron or sub-micron sized pattern features could be lost because the flowing layer would flow over the top of them as opposed to filling in the feature as desired. This identified problem is in addition to the danger of creating voids and other irregularities during the initial CVD deposition. An additional limitation of conventional technologies is that the wafers require additional handling. Generally, the wafers are subjected to at least two steps. First, there is the CVD deposition process within the reactor. Then the wafers are subjected to flow temperatures which may preclude the application of the thermal reflow process to heat sensitive VLSI devices.

Ideally, it would be advantageous to have a deposition/planarization process that would create and deposit a glass film of varying composition by CVD and simultaneously with the deposition flow the layer as to completely fill, without voids, all spaces and trenches between the micron and sub-micron pattern features. This approach would eliminate the difficult requirement of substantially perfect conformality that must be attained by other methods of film deposition if planarization is to be accomplished.

Further, it would be advantageous to be able to achieve these results at temperatures not exceeding the maximum of 950° C. and preferably at or below 875° C. so as to allow the processing of VLSI silicon devices such as complementary metal oxide semiconductor (CMOS) or erasable programmable read only memory (EPROM) devices.

Additionally, it would be advantageous if the glass layer could be synthesized by a fully controlled CVD process from organic or organometallic reactants whose toxicity levels are substantially lower than those of traditionally used hydrides.

A further advantage of using organic or organometallic reactants is that the chemical properties do not involve pyrophoricity and chemical instability during storage. Additional advantages include an increased efficiency for wafer handling and an improved cost efficiency since a greater wafer yield can be obtained.

PRIOR ART REFERENCES

1. Kern et al., *Borophosphosilicate Glasses For Integrated Circuits*, SOLID STATE TECHNOLOGY Vol. 28, 171 (Jun. 1985.)
2. Williams et al., *LPCVD of Borophosphosilicate Glass from Organic Reactants*, J. ELECTROCHEM. SOC'Y; SOLID STATE SCIENCE AND TECHNOLOGY Vol. 134, No. 3, 657, (Mar. 1987).
3. Levy et al., *Low Pressure Chemical Vapor Deposition of Borophosphosilicate Glass Films Produced by Injection of Miscible DADBS-TMB-TMP Liquid Sources*, J. ELECTROCHEM. SOC'Y; SOLID STATE SCIENCE AND TECHNOLOGY Vol. 134, No. 7, 1744 (Jul. 1987).
4. Levy et al., *A New LPCVD Technique for Producing Borophosphosilicate Glass Films by Injection of Miscible Liquid Precursors*, J. ELECTROCHEM. SOC'Y; SOLID STATE SCIENCE AND TECHNOLOGY Vol. 134, No. 2, 430 (Feb. 1987).
5. Kern et al., *Chemically Vapor Deposited Borophosphosilicate Glasses For Silicon Device Applications*, RCA REVIEW Vol. 43, 423 (Sep. 1982).
6. Levy et al., *Viscous Behavior of Phosphosilicate and Borophosphosilicate Glasses in VLSI Processing*, SOLID STATE TECHNOLOGY Vol. 29, 123 (Oct. 1986).
7. Mercier, *Rapid Flow of Doped Glasses for VLSIC Fabrication*, SOLID STATE TECHNOLOGY Vol. 30, No. 7, 85 (Jul. 1987).
8. Becker, et al., *Process and Film Characterization of Low Pressure Tetraethylorthosilicate-Borophosphosilicate Glass*, J. VAC. SCI. TECHNOL. Vol. B4, No. 3, 732 (May/Jun. 1986).

SUMMARY OF THE INVENTION

The present invention describes an integrated dual viscoelastic process that forms a substantially planarized glass layer on a semiconductor device. The process provides for the combined deposition and simultaneous viscoelastic flow of a glass layer substantially free from voids or other layer inconsistencies.

The substrate wafer is initially placed in a CVD reaction chamber. The wafer is heated to a temperature that is comparable to the fusion flow temperature of the glass layer being deposited. Next, vaporized reactants comprised of a combination of silicon, phosphorus and boron compounds are fed into the reaction chamber.

The reactant compounds may be selected from organic, organometallic or inorganic hydride compounds. However, organic and organometallic compounds are used in the preferred embodiment due to the lower toxicity, decreased pyrophoricity and increased chemical stability. Further, the mixture of the reactant compounds may be adjusted to create glass layers of varying compositions.

A high reactant velocity to the substrate surface advantageously maximizes a heterogeneous, surface-controlled reaction while minimizing homogeneous, particle-generating processes, yielding higher quality, more uniform films. In addition to the vaporized reactants, an inert diluent gas and a gaseous oxidant may be added to the reaction chamber.

Advantageously as the glass layer is deposited onto the substrate topography, the glass layer flows, eliminating voids and other layer inconsistencies such as cracking and nonconformal step coverage, into all the spaces and trenches between pattern features of the substrate.

Alternatively, the present invention may be utilized after a wafer has received an initial as-deposited layer without viscoelastic flow, such as an undoped oxide layer, a silicon nitride or other functionally equivalent dielectric layer. The initial layer is deposited such that the topographical features are not completely covered or filled. Then a second layer that may be sacrificed later, is deposited utilizing the viscoelastic flow process to fill the spaces and trenches. Finally, an etch is used to remove the upper surface of the sacrificial layer.

Thus, this approach eliminates the difficult requirement of substantially perfect conformality that must be attained to accomplish topographical planarization. Finally, the present invention provides a continuous and substantially flaw free glass layer of uniform thickness, which are essential characteristics necessary to achieve a higher device yield and higher reliability.

BRIEF DESCRIPTION OF THE DRAWINGS

FIGS. 1a–b show a prior art cross-sectional representation of step coverage of as-deposited film as:
  1a: conformal step coverage, or
  1b: nonconformal step coverage.
FIGS. 2a–c show a cross-sectional representation of a prior art two-step technique involving:
  2a–b: depositing an as-deposited borophosphosilicate glass (BPSG) layer onto a substrate having several trenches etched into a substrate; and
  2c: thermally flowing the as-deposited layer to planarize and to fill the trenches.
FIGS. 3a–c show a cross-sectional representation of a substrate and several trenches during the simultaneous deposition and thermal flow process of a BPSG layer of the preferred embodiment involving:
  3a: depositing and simultaneous flow at the onset;
  3b: condition of the deposition and flow after time (t); and
  3c: substantial planarization of filled trenches.
FIG. 4 shows a cross-sectional representation of a substrate and several trenches with a first single step as-deposited $SiO_2$ layer and a second simultaneous deposition and thermal flow process layer of the alternative embodiment.

FIG. 5 shows a cross-sectional representation of the topography of FIG. 4 after the surface has been subjected to a uniform etch.

DETAILED DESCRIPTION OF THE INVENTION

The present invention describes a method for providing a glass layer deposition on a wafer substrate during the formation of a semiconductor device by using a viscoelastic flow technique wherein the thermal fusion flow of a glass layer occurs simultaneously with the glass layer deposition. In the following description, numerous specific details are set forth such as specific temperatures, flow rates, etc., in order to provide a thorough understanding of the present invention. It will be obvious, however, to one skilled in the art that the present invention may be practiced without these specific details. In other instances well-known processes have not been described in detail in order not to unnecessarily obscure the present invention.

PRIOR ART

Referring to FIG. 1a, conformal step coverage is illustrated. Step coverage relates to surface topography of a deposited film 10 to the various steps on the semiconductor substrate 12. In the ideal or conformal step coverage, film 10 thicknesses are uniform along all surfaces of the step. The uniformity of film thickness, regardless of topography, is due to the rapid migration of reactants after adsorption on the step surfaces.

FIG. 1b shows an example of nonconformal step coverage, which results when the reactants adsorb and react without significant surface migration.

To understand step coverage, it is useful to understand the concept of the arrival angle. The flux of reactant molecules arriving from an angle between $\theta$ and $\theta + d\theta$ can be expressed as $P(\theta)$. The total flux arriving is related to the integral of $P(\theta)d\theta$ from 0 to $2\pi$. The value of the flux integral (and eventually film thickness) is directly proportional to the range of angles for which $P(\theta)$ is not zero. This range is called the arrival angle. Generally, at the top of the step 33, $P(\theta_2)$ is non-zero over a range of 270°, whereas in the planar case, $P(\theta_1)$ is non-zero over a range of 180°.

In this instance, the deposition rate is proportional to the arrival angle $\theta$ of the gas molecules. Reactants arriving along the top horizontal surface come from many different angles and have an arrival angle $\theta_1$ that varies in two dimensions from 0° to 180°; while reactants arriving at the top of a vertical wall have an arrival angle $\theta_3$ that varies from 0° to 90°. Thus, the film 11 thickness on the top surface is double that of a wall 13.

Further down the wall 13 and eventually to the bottom of the trench 14, $\alpha$ is related to the width of the opening 17 and the film thickness is proportional to:

$$\alpha \approx \arctan W/d$$

where d is the distance from the top surface, W is the width of the opening. This type of step coverage is thin along the vertical walls 13 cracking is possible at the bottom 15 of the step due to self-shadowing. Shadowing generally occurs when substrate surface features near to points being impinged upon block the straight paths of reactant molecules. The shadowed areas experience less deposition and less resulting film thickness.

Referring to FIGS. 2a and 2b, a conventional as-deposited glass layer 100 is formed over the surface of several trenches 103. The trenches 103 are formed by conventional etching techniques in a substrate 102 of a wafer. Typical deposition conditions for a borophosphosilicate glass (BPSG) layer are based on substrate temperatures of approximately 410° to 450°, an oxygen-to-hydride ratio of 20:1, and film deposition rates of about 100 angstroms per minute. The silicon to boron ratio is adjusted according to the fusion temperature desired. Generally increasing the boron content lowers the fusion temperature.

Referring to FIG. 2c, the fully filled trenches 103 are shown. Once the as-deposited layer 100 is formed at a reduced deposition temperature in a reaction chamber, the wafer is removed from the reaction chamber and heat treated to achieve an adequate glass flow. An adequate glass flow appears to be achieved at temperatures ranging from 800° to 900° C. However, a problem that may occur when flowing the glass layer after the initial deposition, is the formation of voids. Referring to FIG. 2b, the as-deposited layer 100 is deposited similar to nonconformal step coverage as shown in FIG. 1b where the corners of the trenches 103 are thicker than the bottom of the trench.

Referring to FIG. 2c, as the layer 100 is heat treated and the temperature raised sufficiently to allow for glass flow, the flowing glass would create a void 105, as the glass flows over a small opening 101 where the layer was unevenly deposited rather than filling in the trench 103 completely.

Present Invention

FIGS 3a–c illustrate a schematic representation of a planarized topography where the trenches 203 in the substrate 202 are completely filled without voids or other irregularities. The viscoelastic process comprises an integrated dual process for glass deposition and simultaneous flowing of the material onto a wafer substrate 202 of a semiconductor wafer 201. In the preferred embodiment, the process comprises the use of TEOS, an organic silicon compound; triethylborate (TEB), an organic boron compound; triethylphosphate (TEPO), an organic phosphorus compound; a gaseous oxidant and inert diluent gas. While the preferred embodiment is descriptive of organic reactants, the use of conventional inorganic hydrides or organometallic compounds or a combination of inorganic hydrides and organic reactants as reactants would be within the scope and spirit of the present invention. Although an inert diluent gas, either argon or nitrogen, is described in the preferred embodiment, the present invention may be practiced without the use of either inert gas diluent. Additionally, a gaseous oxidant of oxygen is described in the preferred embodiment, the present invention may be practiced using ozone or nitrous oxide as a gaseous oxidant.

In the preferred embodiment, a liquid reactant mixture of TEOS, TEB, and TEPO is transferred to a CVD reaction chamber as a vapor mixture, previously generated in a vaporizer unit of the CVD reactor. In the preferred embodiment, the deposition process is carried out in a CVD reactor system that allows a high reactant velocity to the substrate surface by maintaining a high velocity laminar flow. The high reactant velocity maximizes the desirable heterogeneous, surface-controlled reaction while the homogeneous, particle generating process is minimized. While the reactor system used in the preferred embodiment is described in a copending U.S. patent application, Ser. No. 07/015,359, filed Feb. 17, 1987, entitled "Chemical Vapor Deposition Reactor and Method of Use Thereof" and incorporated by reference, other reactor systems capable of achieving a high velocity laminar flow may also be used to gain the advantage of low-particle, uniform film deposition.

Measured volumes of the liquid reactants are injected into the vaporizer to generate the quantity of reactant vapor needed for the CVD reaction. The pressure and temperature of the vaporizer are chosen to completely vaporize all the liquid reactants without inducing thermal decomposition or other changes of the reactants. In the preferred embodiment, the vaporization temperatures are in the range of 150° to 275° C., while the CVD reactor system pressure is in the range of 0.5 to 100 torr. However, the system pressure can vary beyond the range of the preferred embodiment and still be within the scope and spirit of the present invention.

The use of a high velocity laminar flow allows the film 200 deposition at temperatures in the range of 750°–950° C., which are much higher than would be possible in conventional systems where temperatures are generally 300°–400° C. As a consequence, glass film 200 deposition can be carried out at temperatures compatible with glass thermal fusion or viscoelastic flow, while still maintaining uniform film deposition, thus accomplishing deposition and thermal fusion flow simultaneously.

FIGS. 3a and 3b describe the initial deposition profile of the present invention as well as the deposition and flow process, wherein the interiors of the wells are filled evenly and uniformly. The surface tension, represented by arrows 400, at the interior side walls of the trench 203 exert a force sufficient to pull the glass into the trench 203, rounding the interior and eliminating the likelihood of voids.

As shown in FIG. 3c, this dual process permits the glass to fill all recesses, spaces, and trenches 203 in the wafer 201 topography so as to form a planar insulation coating over the entire substrate 202. The simultaneous deposition and flow inhibits the formation of voids and eliminates the inconsistencies of layer coverage inherently present in nonconformal coverage. During the simultaneous deposition and thermal fusion flow, the glass is densified, creating a glass containing dopants which ultimately lowers the temperature required to flow the glass and increasing the degree of fusion. Although, the present process operates at temperatures in the range of 750°–950° C. that can be potentially damaging to VSLI silicon devices, the simultaneous deposition and flow occur at much shorter time period, thus minimizing the temperature effects on the device.

An alternative method of practicing the present invention, as shown in FIG. 4, comprises depositing by conventional prior art deposition processes, an initial layer 300 of insulator material such as a dielectric without viscoelastic flow and a sacrificial layer 304 such as BPSG by the viscoelastic flow process. Although the alternative method illustrates the use of a dielectric for the initial layer 300 and BPSG for the sacrificial layer 304, it would still be within the principles of the present invention to use a dielectric for the initial layer 300 and phosphosilicate glass (PSG) or borosilicate glass (BSG) for the sacrificial layer 304. The initial layer 300 of insulator material is typically an undoped oxide, silicon nitride or a functionally equivalent dielectric. The conventional deposition of the initial layer 300 continues until a pre-determined thickness is achieved. The conventional deposition continues until the trenches 303 are almost completely filled that is, not allowing the trenches 303 to be closed, therefore preventing void formation that could be formed if the structure were to be closed. While the wafer 301 is still within the CVD reactor, a second deposition of the sacrificial layer 304 is carried out by the viscoelectric flow process described in reference to FIGS. 3a-b.

Referring to FIG. 5, once the sacrificial layer 304 is deposited, a non-selective wet or dry etch is performed to reduce the layer thickness of the wafer 301 thereby obtaining a planarized surface and filled trenches 303 without the formation of a void 105, as shown in FIG. 2c. In the alternative practice of the present invention, the etching is accomplished by a conventional prior art reactive ion etch. However, any wet or dry etch process may be used and still be within the scope and spirit of the present invention.

EXAMPLE 1

A typical example that demonstrates the preferred method of practicing the present invention is described. The description is neither comprehensive nor limiting and is intended only to serve as an example. In accordance with the principles, modifications and alternatives may be devised by those skilled in the art without departing from the spirit and scope of the present invention.

The BPSG is synthesized by low pressure chemical vapor deposition (LPCVD) from TEOS, TEB, and TEPO with argon (Ar) and oxygen ($O_2$) at 900° C. to produce a silicate glass composition of approximately 6 wt % boron (B) and 4 wt % phosphorus (P). The specific conditions are as follows:

(a) ternary liquid mixture of 22.9 mol % TEOS, 31.2 mol % TEB, and 45.9 mol % TEPO;
(b) flow rate of liquid mixture to reactor is 3 g/min (495 sccm/min in gas phase after vaporization);
(c) $O_2$ flow rate=742 sccm/min, Ar flow rate=2275 sccm/min;
(d) pressure in the CVD reaction system=1.2 torr;
(e) temperature to which substrate wafers were exposed is 900° C.;
(f) an elapsed time of 10 minutes resulted in a glass thickness on the substrate wafers of approximately 10 microns ($\mu m$).

EXAMPLE 2

In another example, the BPSG is synthesized by LPCVD from TEOS, TEB, and triethylphosphine with oxygen ($O_2$) at 850° C. to produce a silicate glass composition of approximately 4 wt % boron (B) and 6.5 wt % phosphorus (P). The specific conditions are as follows:

(a) ternary liquid mixture of 37 mol % TEOS, 33 mol % TEB, and 30 mol % triethylphosphine;
(b) flow rate of liquid mixture to reactor is 3 g/min;
(c) $O_2$ flow rate=24 sccm
(d) pressure in the CVD reaction system=1.0 torr;
(e) temperature to which substrate wafers were exposed is 850° C.;
(f) an elapsed time of 3 minutes resulted in a glass thickness on the substrate wafers of approximately 1.2 $\mu m$.

Thus a process to permit simultaneous deposition and thermal fusion flow of an insulating glass layer, affecting a complete planarization of a substrate surface is described.

We claim:

1. An integrated dual step viscoelastic process for forming a borophosphosilicate glass (BPSG) layer on a wafer substrate (wafer), comprising the steps of:
    adjusting the reaction temperature in a chemical vapor deposition (CVD) reaction chamber to be compatible with a flow temperature of said BPSG layer, said flow temperature being within a range of 750° C.-950° C.;
    placing said wafer in said CVD reaction chamber;
    introducing vaporized reactants comprised of an organic silicon source, an organic phosphorous source, and an organic boron source into said CVD reaction chamber, wherein said silicon source is a liquid at room temperature;
    adjusting the flow velocity of said vaporized reactants to maintain a high velocity laminar flow of said reactants to said wafer for achieving a low particle, uniform layer; and
    forming said BPSG layer at a flow temperature such that thermal flow of said BPSG layer is accomplished simultaneously with deposition of said BPSG layer.

2. An integrated dual-step chemical vapor deposition (IDSCVD) process for forming a borophosphosilicate glass (BPSG) layer on a generally planar patterned wafer substrate (wafer) comprising the steps of:
    placing said wafer in a reduced pressure chemical vapor deposition (CVD) reaction chamber;
    heating said wafer to a reaction temperature, said reaction temperature being within a range of 750° C.-950° C.;
    introducing vaporized reactants comprised of tetraethylorthosilicate (TEOS) as a silicon source, a phosphorus source, and a boron source into said CVD reaction;
    adjusting the flow of velocity of said vaporized reactants to maintain a high velocity laminar flow of said reactants to said wafer for achieving a low particle, uniform BPSG layer;
    simultaneously introducing with said vaporized reactants, a gaseous oxidant into said reaction chamber; and
    forming a simultaneously deposited and flowed low particle, uniform BPSG layer on said wafer.

3. The IDSCVD process as recited in claim 2, wherein said gaseous oxidant is oxygen.

4. The IDSCVD process as recited in claim 3, wherein said laminar flow is adjusted to approximately 100 to 2000 sccm per wafer.

5. The IDSCVD process as recited in claim 2, wherein said phosphorous source is thriethylphosphate (TEPO).

6. The IDSCVD process as recited in claim 2, wherein said boron source is triethylborate (TEB).

7. The IDSCVD process as recited in claim 2, wherein said reaction temperature is within a range of 800° C.-950° C.

8. A chemical vapor deposition (CVD) process for forming a borophosphosilicate glass (BPSG) layer on a generally planar wafer substrate (wafer) comprising the steps of:
    heating said wafer to a predetermined reaction temperature, said reaction temperature being within a range of 750° C. to 950° C.;
    placing said wafer in a reduced pressure CVD reaction chamber;
    first depositing a dielectric layer onto said wafer to a predetermined thickness wherein said thickness substantially covers surface patterns on said wafer without closing any of said pattern;

introducing vaporized reactants selected from a group consisting of tetraethylorthosilicate as a silicon source, a phosphorus source and a boron source into said reaction chamber;

adjusting the flow velocity of said vaporized reactants to maintain a high velocity laminar flow of said reactants to said wafer for achieving a low particle, uniform BPSG layer;

simultaneously introducing with said vaporized reactants, a gaseous oxidant into said reaction chamber; and forming a simultaneously deposited and flowed glass layer on said wafer.

9. The CVD process as recited in claim 8, wherein said gaseous oxidant is oxygen, oxide or nitrous oxide.

10. The CVD process as recited in claim 8, wherein said step of introducing a gaseous oxidant includes introducing an inert diluent gas with said gaseous oxidant.

11. The CVD process as recited in claim 10 wherein said inert diluent gas is argon or nitrogen.

12. The CVD process as recited in claim 8, wherein said dielectric layer is selected from a group of insulator materials consisting of undoped silicon oxide and silicon nitride.

13. The CVD process as recited in claim 8, wherein said simultaneously deposited and flowed BPSG layer is non-selectively etched.

14. The CVD process as recited in claim 13, wherein said non-selective etch is accomplished by a reactive ion etch.

15. The CVD process as recited in claim 8, wherein said reaction temperature is within a range of 800° C.-950° C.

16. An integrated dual-step chemical vapor deposition (IDSCVD) process for forming a borophosphosilicate glass (BPSG) layer on a generally planar patterned wafer substrate (wafer) comprising the steps of:

placing said wafer in a reduced pressure chemical vapor deposition (CVD) reaction chamber;

heating said wafer to a reaction temperature within a range of 750° C. to 950° C.;

introducing vaporized reactants comprised of tetraethylorthosilicate (TEOS) as a silicon source, a phosphorus source, and a boron source into said CVD reaction chamber;

adjusting the flow velocity of said vaporized reactants to maintain a high velocity laminar flow of said reactants to said wafer to maximize a heterogeneous, surface-controlled reaction and to minimize a homogeneous, particle generating process to achieve a low particle, uniform layer;

simultaneously with introducing said vaporized reactants, introducing a gaseous oxidant into said reaction chamber; and forming a simultaneously deposited and flowed low particle, uniform BPSG layer on said wafer.

17. The IDSCVD as recited in claim 16, wherein said gaseous oxidant is oxygen.

18. The IDSCVD as recited in claim 16 wherein said high velocity laminar flow is approximately 100 to 2000 sccm per wafer.

19. The IDSCVD as recited in claim 16 wherein said step of introducing a gaseous oxidant includes introducing an inert diluent gas with said gaseous oxidant.

20. The IDSCVD as recited in claim 19 wherein said inert diluent gas is argon.

21. The integrated dual step viscoelastic process as recited in claim 16, wherein said reaction temperature is within a range of 800° C.-950° C.

* * * * *